United States Patent [19]
Onodera

[11] Patent Number: 5,908,282
[45] Date of Patent: Jun. 1, 1999

[54] METHOD FOR MOUNTING COMPONENTS AND APPARATUS THEREFOR

[75] Inventor: Hitoshi Onodera, Iwata, Japan

[73] Assignee: Yamaha Hatsudoki Kabushiki Kaisha, Iwata, Japan

[21] Appl. No.: 08/911,328

[22] Filed: Aug. 14, 1997

Related U.S. Application Data

[62] Division of application No. 08/103,358, Aug. 9, 1993, Pat. No. 5,741,114.

[30] Foreign Application Priority Data

Aug. 7, 1992 [JP] Japan ................................. 4-211839

[51] Int. Cl.$^6$ ................................................. G01B 11/00
[52] U.S. Cl. ............................. 414/783; 901/47; 29/757
[58] Field of Search ................................. 414/754, 783, 414/787; 29/740, 743, 757; 901/17, 35, 40, 41, 47; 483/8, 10

[56] References Cited

U.S. PATENT DOCUMENTS

| | | |
|---|---|---|
| 4,973,216 | 11/1990 | Domm . |
| 5,105,528 | 4/1992 | Soth et al. . |
| 5,194,948 | 3/1993 | L'Esperance, III et al. . |
| 5,208,761 | 5/1993 | Michigami et al. . |
| 5,255,429 | 10/1993 | Nishi et al. . |
| 5,278,634 | 1/1994 | Skunes et al. . |
| 5,374,091 | 12/1994 | Gore et al. . |

FOREIGN PATENT DOCUMENTS

| | | |
|---|---|---|
| 0293175 | 11/1988 | European Pat. Off. . |
| 0416878 | 3/1991 | European Pat. Off. . |
| 0471272 | 2/1992 | European Pat. Off. . |
| 2183820 | 6/1987 | United Kingdom . |
| WO A 8502088 | 5/1985 | WIPO . |
| WO A 9214988 | 9/1992 | WIPO . |

OTHER PUBLICATIONS

European Search Report dated Nov. 16, 1993.
Patent Abstracts of Japan, vol. 013, No. 173 (E–748) Apr. 24, 1989 & JP–A–64002400.
European Search Report dated Feb. 25, 1994.
European Search Report dated Mar. 1, 1994.
European Search Report dated Aug. 1, 1996.

*Primary Examiner*—Karen M. Young
*Assistant Examiner*—Gregory A Morse
*Attorney, Agent, or Firm*—Knobbe, Martens, Olson & Bear LLP

[57] ABSTRACT

A component mounting device adapted to mount components such IC or the like on a printed circuit board that includes replaceable pick up nozzles to accommodate different types of components to be picked up. A sensing station is provided that permits the pick up nozzle to be verified as the correct one. The same sensing station is employed to sense both the orientation of a component that is picked up and also whether the component is correctly oriented for deposit. This is done by measuring projected lengths in a plane with a photo sensitive device and by making calculations in accordance with trigonometric relationships.

73 Claims, 11 Drawing Sheets

METHOD FOR MOUNTING COMPONENTS AND APPARATUS THEREFOR

This application is a divisional of U.S. patent application Ser. No. 08/103358, filed Aug. 9, 1993, now U.S. Pat. No. 5,741,114.

BACKGROUND OF THE INVENTION

This invention related to a method for mounting components and an apparatus therefor and more particularly to an improved arrangement that permits the accurate picking up and mounting of components and a method for performing such operations.

There are a wide variety of applications wherein components are picked up from a feed section where they are delivered and moved to and placed at an accurate location. A wide variety of devices are employed for actually picking up the components. Frequently such pick up devices employ vacuum nozzles for picking up the components.

A specific application for this type of apparatus and method is in the making of printed circuit boards. With such printed circuit boards, it is common to employ a device called a "chip mounter" that picks up small components such as integrated circuits, resistors or capacitors at a feed section and places them on a printed circuit board. Vacuum nozzles are frequently employed as the pick up devices.

In order to render such devices more versatile, it has been proposed to provide an arrangement wherein the form and type of pick up nozzle employed may be readily changed so as to suit particular components. This nozzle changing may be done either manually or automatically.

The criticality for accurately mounting such components is readily apparent. However, in the process of mounting the nozzle, mistakes may be made even if the apparatus functions automatically and these mistakes can result in inaccurate mounting of the components and other problems.

It is, therefor, a principle object of this invention to provide and improved apparatus and method for mounting components employing interchangeable pick up devices.

It is further object of this invention to provide: a method and apparatus that employs such types of pick up devices and which is operative to sense certain characteristics of the pick up device.

One way in which the method and apparatus functions to sense the pick up nozzle before the component is picked up so as to determine if the correct pick up nozzle is installed.

One of the operations that may be performed on the component once it is picked up by the pick up device is a sensing operation that will sense the orientation of the component relative to the pick up device so as to make a corresponding correction in the movement of the component to the mounting position so that it will correctly mounted. One type of device for such sensing involves rotation of the component in front of an optical sensor.

In addition to the problems of pick up misorientation, frequently it is possible that the pick up device will pick up the component not only at an orientation other than desired but the component actually incorrectly picked up. For example, the component normally has a lower surface that is intended to positioned on the device in which it is to be mounted such as a printed circuit board or the like. However, if the component is picked up off center it may actually rotate from the normal orientation so that the surface that is to be mounted will not be facing downwardly. If an attempt is made to mount the component in this orientation, damage can result. If, however, separate measures need be taken both to determine the orientation of the article as picked up and also whether the article has been picked up properly, the speed of the machine can be slowed considerably.

Therefor, it is a still further object of this invention to provide an improved method and apparatus for performing a single operation that is effective both to sense the orientation in which the component has been picked up and also to determine whether the component has been correctly picked up.

It is a still further object of this invention to provide an improved and simplified method and apparatus by which the correct picking up of a component by a pick up device may be determined.

SUMMARY OF THE INVENTION

A first feature of the invention is adapted to be embodied in a component handling device that is adapted to pick up and position components which comprises a pick up portion. A sensing station is provided that is adapted to sense a condition of an article. Means are provided for positioning the pick up portion in the sensing station for sensing the condition of the pick up portion. In accordance with one feature of the invention, the identity of the pick up portion is determined.

A further feature of the invention is adapted to be embodied in a component handling apparatus for accurately positioning components. The apparatus comprises a pick up portion for picking up and positioning a component. A sensing station is provided for recognizing the orientation of the component as picked up by the pick up portion. Means are provided for determining from the recognition both the orientation of the component relative to the pick up portion and if the component as picked up is oriented so that it can be position properly.

A still further feature of the invention is adapted to be embodied in an apparatus for determining if a three dimensional object has been correctly picked up by a pick up portion. The apparatus includes means for measuring the length of the component as picked up in one coordinate of a three dimensional coordinate system. Means are provided for comparing the measured length to a selected one of the dimensions of the object. If the measured length is not approximately equal to the selected dimension then means determine that the component has not been correctly picked up.

A further feature of the invention is adapted to be embodied in a method of picking up and positioning components with a pick up portion. In accordance with this method, the pick up portion is scanned to determine a characteristic of it. In accordance with one facet of this method, the identity of the pick up portion is determined.

Another facet of the invention is adapted to be embodied in a method for determining the condition of a component that is picked up by a pick up portion. In accordance with this method, the orientation of the component as picked up is determined and from this determination both the orientation of the component relative to the pick up portion and if the component as picked up is oriented so that it can be positioned properly are determined.

A still further feature of the invention is adapted to be embodied in a method of determining a three dimensional object has correctly be picked up by a pick up portion. The method comprises the steps of measuring the length of the component as picked up in one coordinate of a three dimensional coordinate system. The thus measured length is then compared to a selected one of the dimensions of the object. It is determined if that the object has not correctly been picked up if the comparison is not approximately equal.

DETAILED DESCRIPTION OF THE PREFERRED EMBODIMENTS OF THE INVENTION

Figure 1:
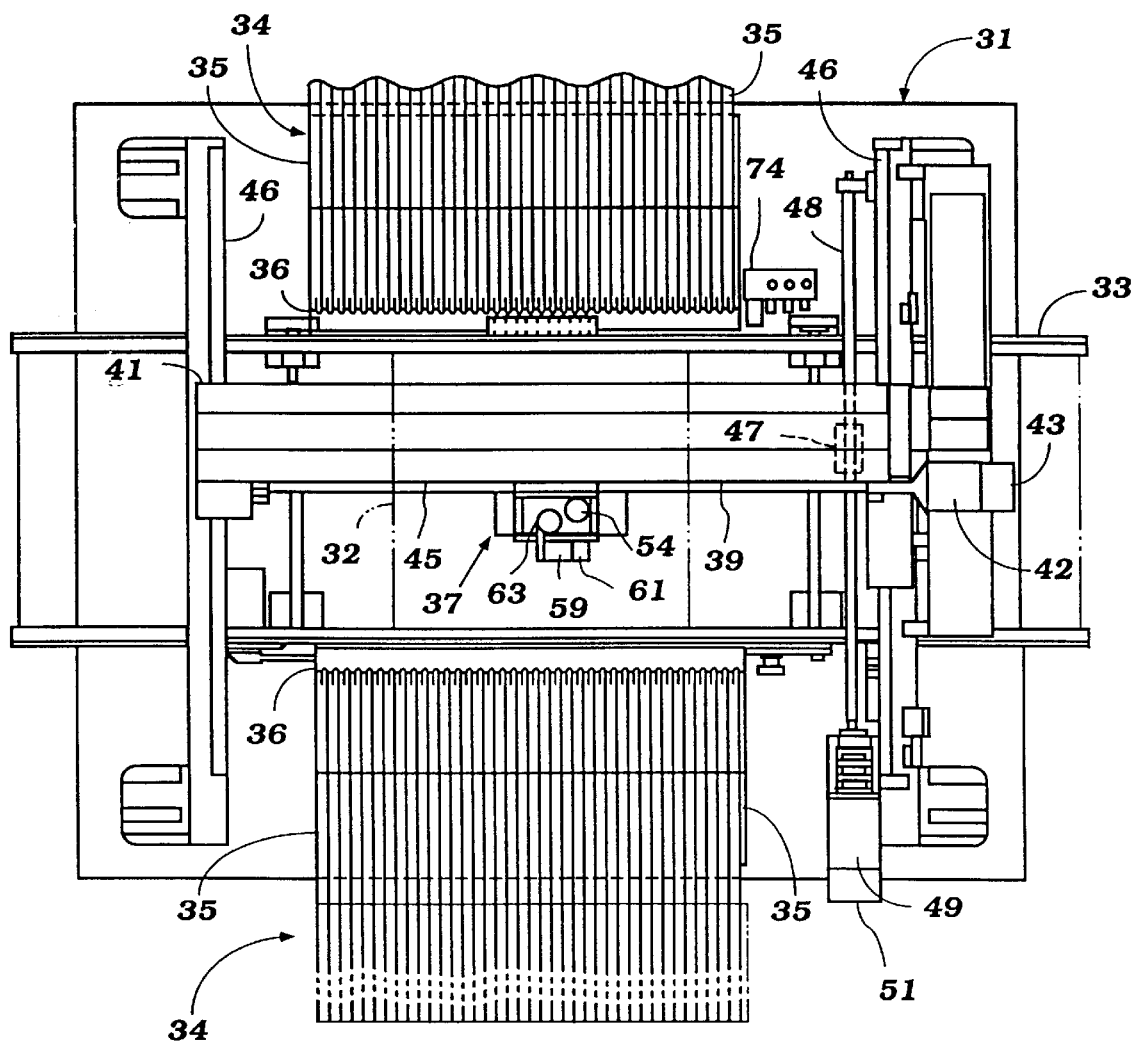
FIG. 1 is a top plan view of a mounting apparatus constructed in accordance with an embodiment of the invention and adapted to perform methods corresponding to the invention.
Figure 2:
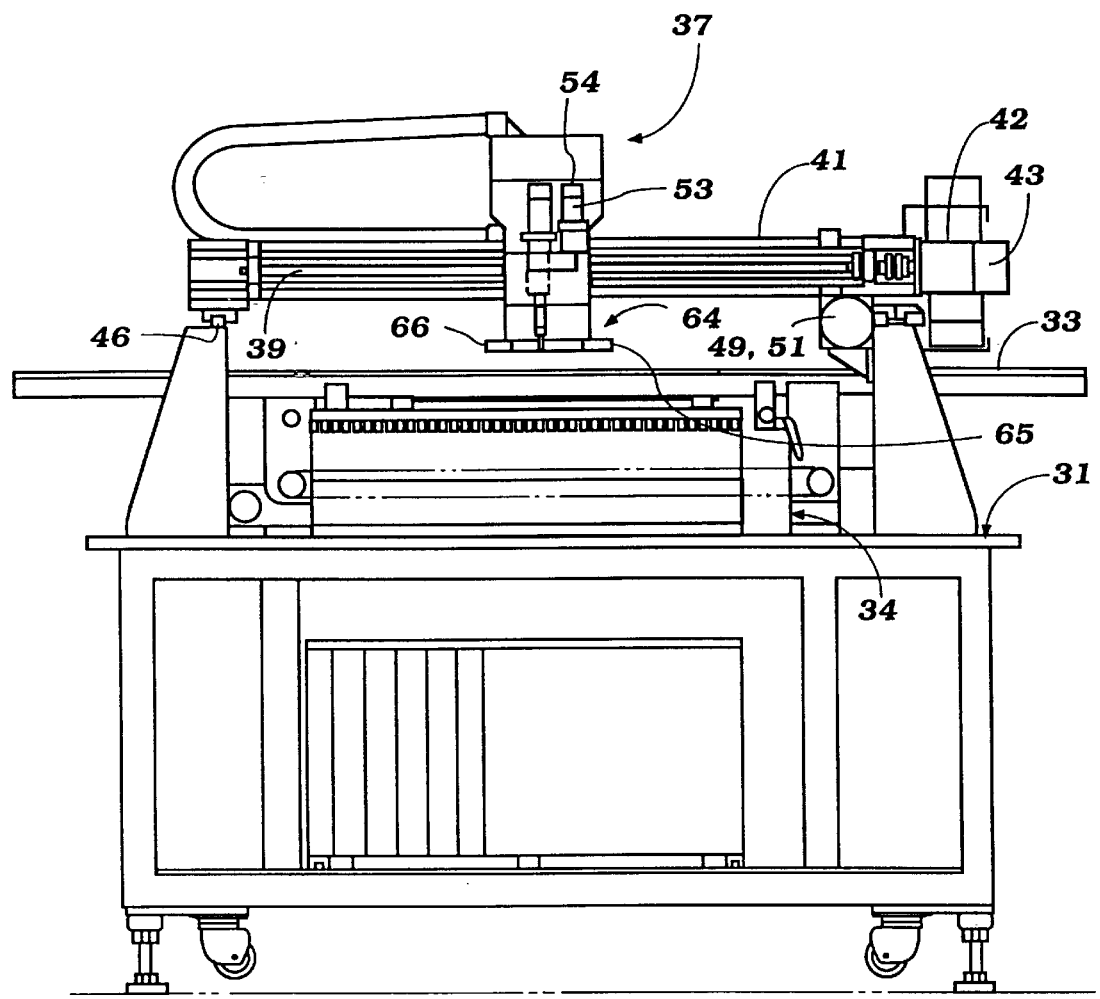
FIG. 2 is front elevational view of the apparatus.

Referring now in detail to the drawings and initially to FIGS. 1 and 2, a chip mounting apparatus constructed in accordance with an embodiment of the invention is identified generally by the reference numeral 31. The chip mounting apparatus 31 is adapted to mount small components such as IC's resistors or capacitors on printed circuit boards 32 that are presented to a mounting station by a conveyor 33 which conveyor extends transversely across the apparatus.

These individual components are presented at delivery stations 34 that are positioned at opposite sides of the conveyor 33 and which are comprised of a plurality of individual rachet operated tape feeders 35. These types of devices are well known and are comprised of carrying tape having individual pockets in which the individual components are positioned. The actual pick up stations are indicated at 36 and are positioned closely adjacent opposite sides of the conveyor 33.

A pick up head assembly, indicated generally by the reference numeral 37 and having a construction that will be described is mounted for movement between the pick up stations 36 and the circuit board 32 for picking up the components and depositing them. In addition, certain other operations will be described later.

The head assembly 37 has a ball nut 38 (FIG. 3) that is drivingly engaged with a feed screw 39 which is, in turn, rotatably carried on a carriage 41. Rotation of the feed screw 39 moves the head assembly 37 in the X—X direction and a driving motor 42 is provided at one end of the carriage 41 for driving the feed screw 39. An encoder 43 is driven by the motor 42 and provides a signal to a control unit, indicated generally by the reference numeral 44 and as shown in the schematic view of FIG. 5, which shows the interrelationship of various components. Guide rails 45 are also provided on the carriage 41 for guiding the movement of the head assembly 37 in the X—X direction.

The carriage 41 is itself moveable along the Y—Y axis being mounted for this movement on a pair of parallel guide rails 46 that extend on opposite sides of the feeder stations 34. The carriage 41 has a ball nut 47 that is engaged with a Y—Y axis drive screw 48 which is journalled appropriately on the mechanism 31 and which is driven by an electric drive motor 49. An encoder 51 is coupled for rotation with the drive motor 49 so as to provide a signal indicative of the position of the pick up head assembly 37 in the Y—Y axis.

Figure 3:
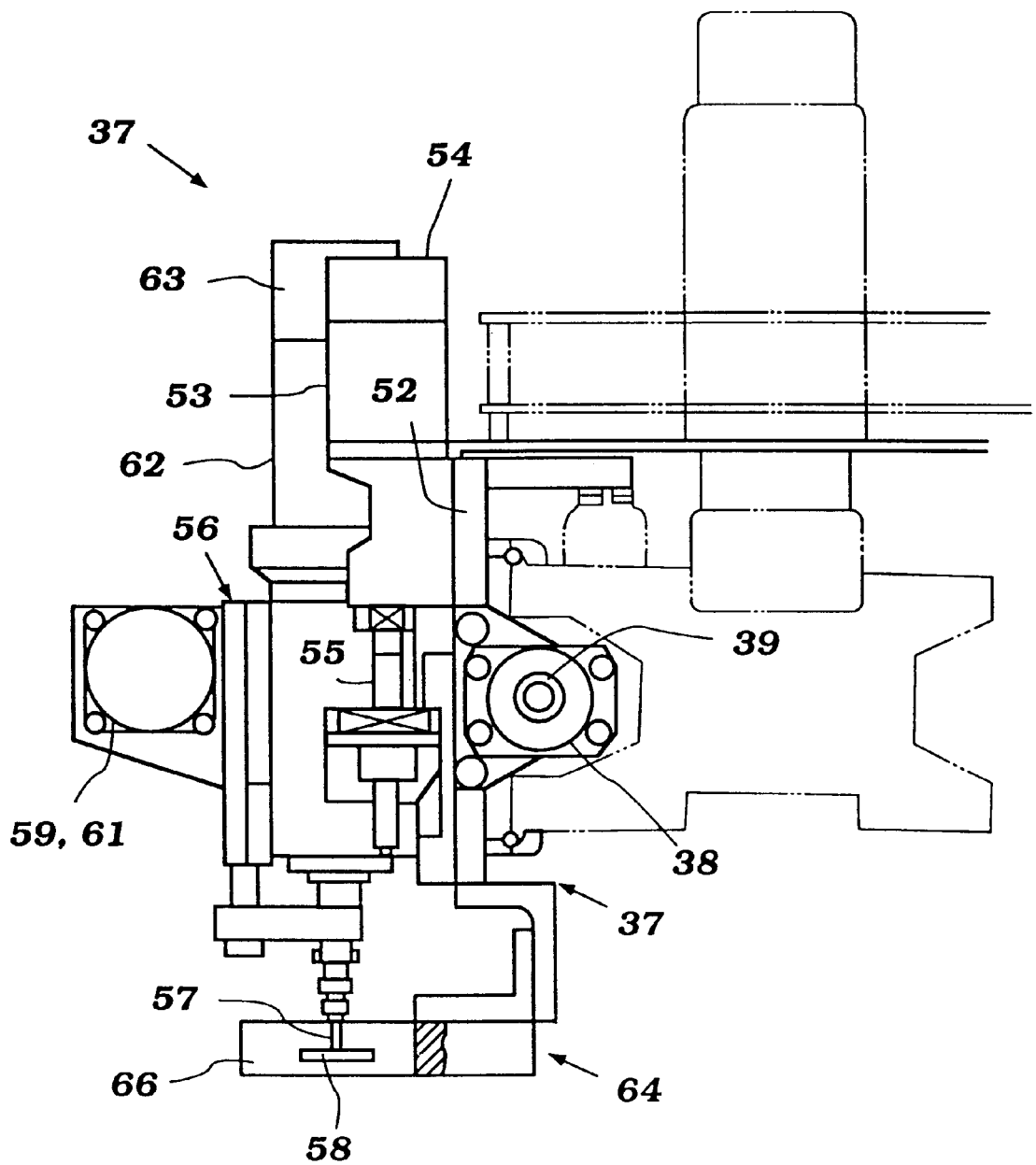
FIG. 3 is an enlarged side elevational view, with a portion shown in section, showing the pick up nozzle and its supporting mechanism.

The head assembly 37 will now be described in detail by primary reference to FIG. 3 although certain of the components are also shown in FIGS. 1 and 2 and the interrelationship of the components is shown schematically in FIG. 5. The head assembly 37 includes a support plate 52 that is mounted for movement along the guide rails 45 and which support a Z axis drive motor 53 having an encoder 54 that provides an output signal indicative of the position of the head assembly 37 along the Z axis. The Z axis drive motor 53 drives a feed screw 55 that has a connection to a ball nut of a pick up head, indicated generally by the reference numeral 56. The pick up 56 is adapted to receive a pick up nozzle 57 of the vacuum operated type. As will be described later, the pick up nozzles 57 are detachably connected to the pick up head 56 so as to provide replacement to accommodate various types of components, indicated generally by the reference numeral 58 that may be picked up by the pick up head 37. The pick up nozzle 57 is mounted also for movement in the Z—Z axis relative to the support plate 52 and is so driven by a servo motor 59 which also has an encoder 61 coupled to it so as to provide an indication of the position of the pick up nozzle 57 relative to the support plate 52. Thus, by determining the positions from the encoders 61 and 54, the location of the pick up nozzle 57 on the Z—Z axis may be readily determined.

The pick up nozzle 57 is also rotatably about a rotational axis R and is driven for this rotation by a rotational axis servo motor 62. The rotational axis servo motor 62 also drives an encoder 63 so as to provide an output signal indicative of the rotational position of the pick up nozzle 57, for a reason which will be described.

Figure 7:
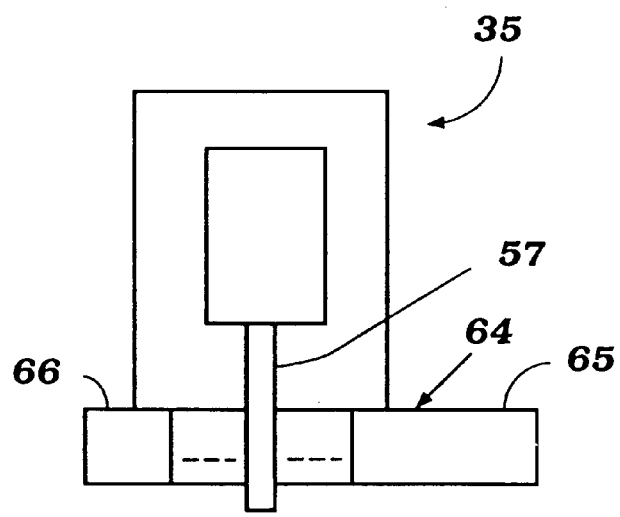
FIG. 7 is an enlarged front elevational view showing the sensing apparatus for the pick up nozzle.
Figure 8:
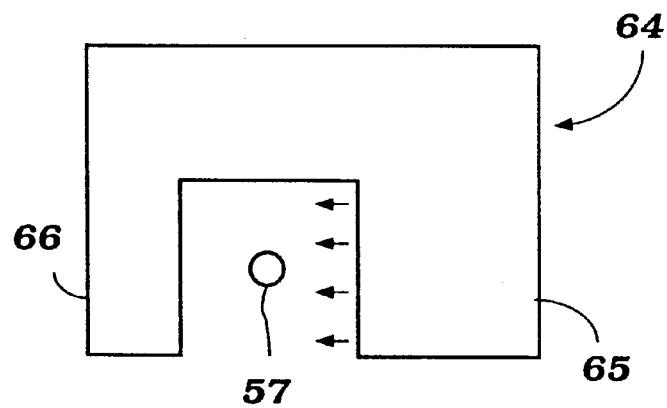
FIG. 8 is a top plan view of the portion of the construction shown in FIG. 7.

Also mounted on the head assembly 37 and specifically the support plate 52 is a sensor device, indicated generally by the reference numeral 64 which, in the illustrated embodiment, is an optical sensor that is comprised of a laser sight source 65 that emits a plurality of parallel light rays as shown FIG. 7 and 8 to a detector unit in the form of a CCD 66. The detector unit 64 functions, as will become apparent, so as to sense objects which obscure the light rays as determined by the output of the detector 66. The output of the sensor 64 being coupled to a processor unit 67 (FIG. 5)

also carried by the assembly unit 37 and specifically the supporting plate 52.

Figure 5:
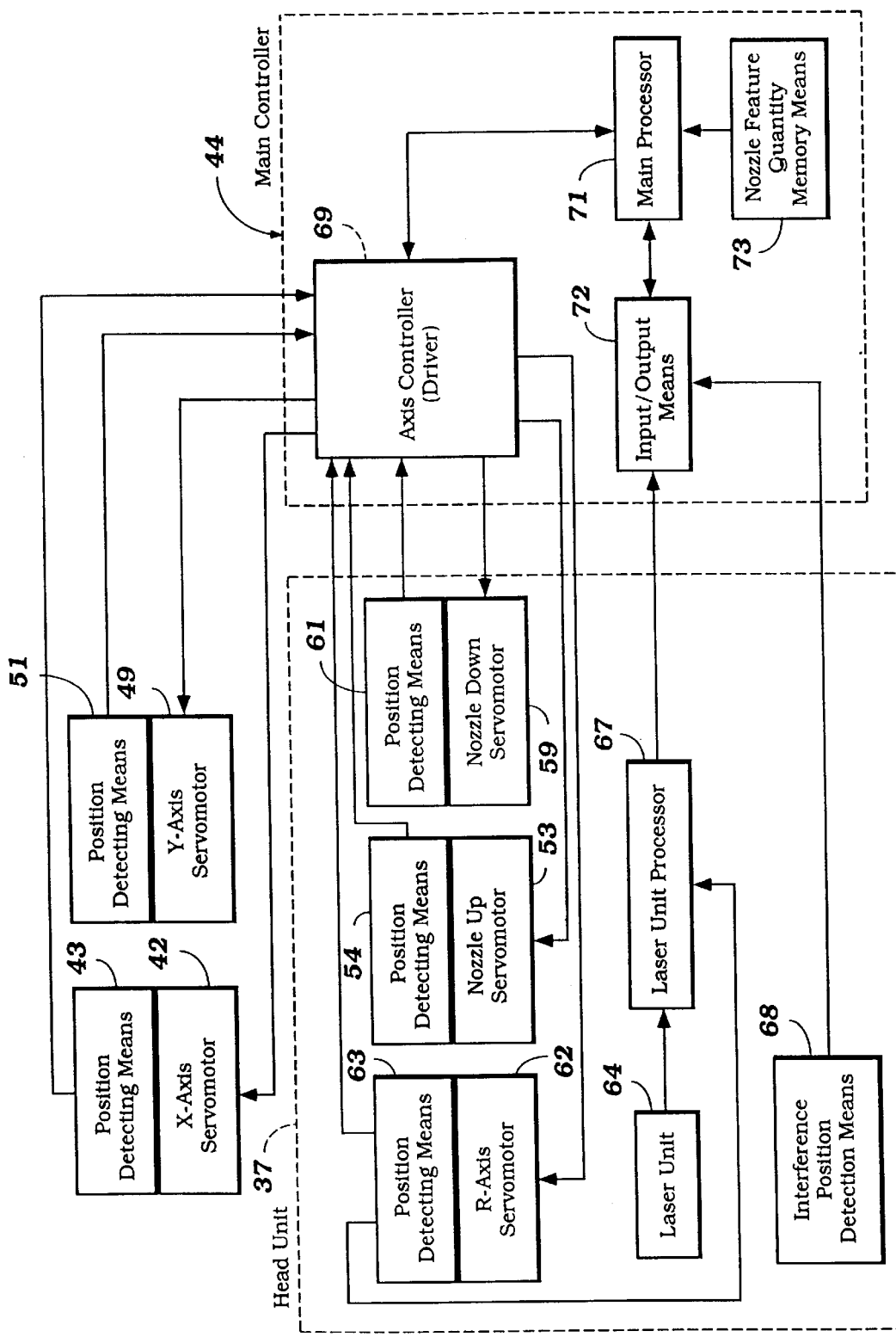
FIG. 5 is a partially schematic view showing the arrangement of the components of the apparatus and their interrelationship.

The head assembly 37 also includes an interference position detecting means which appears only schematically in FIG. 5 and which is identified generally by the reference numeral 68. This interference position detecting means 68 outputs a signal which indicates when the pick up nozzle 57 and a component 58 carried thereby has been elevated sufficiently in the direction of the Z—Z axis so as to clear the pick up stations 36 and permit movement of the mounting head 37 in the X—X and Y—Y directions to begin. By beginning movement immediately after the pick up area 36 has been cleared, the speed of operation of the mechanism can be greatly improved.

The remaining components of the control system will now be described by reference to FIG. 5. The outputs form the various position detectors 43, 51, 61, 64 and 69 are all transmitted to an axis controller or driver 69 which also outputs control signals to the various servo motors 42, 49, 53, 59 and 62 for their operation. The axis controller 69 is controlled by a main processor unit 71 of the controller 44 which also receives signals from the laser processor unit 67 and the interference position detecting means 68 through an input output circuit 72. The device further includes a memory 73 that is pre-programmed with certain information indicative of the profile of the pick up nozzles 57 which, as has been aforenoted, are replaceable.

Figure 4:
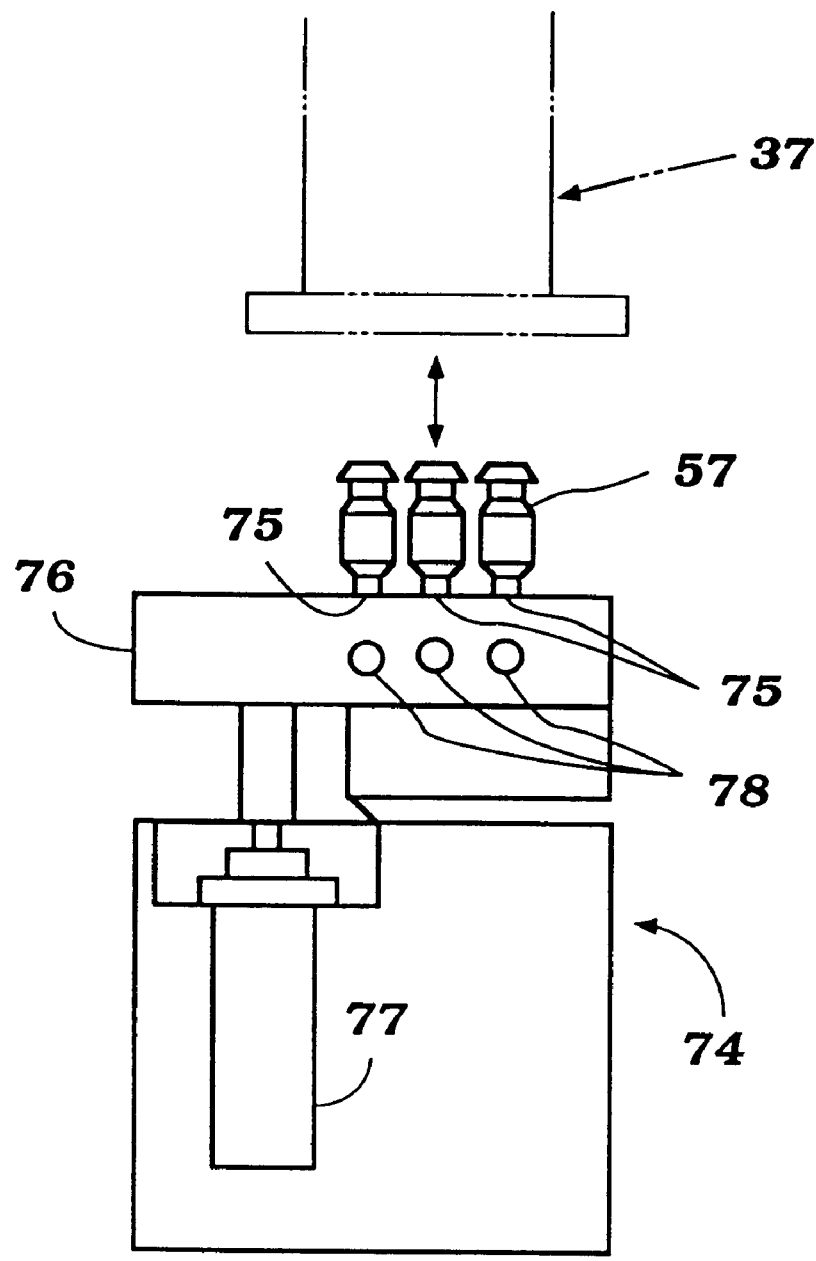
FIG. 4 is an enlarged side elevational view showing the pick up nozzle mounting section.

Turning now to the replacability of the nozzles 57, there is provided at one side of one of the feeders stations 34 on the apparatus 31 afixed nozzle replacement section, indicated generally by the reference numeral 74. The section 74 is adapted to carry a plurality of different types of pick up nozzles 57 and when the pick up head 37 is placed in registry with the nozzle replacement section 74, as shown in phantom in FIG. 4, pick up nozzles 57 may be installed or removed.

These pick up nozzles 57 are carried on holding portions 75 of a movable plate assembly 76 which is, in turn, raised and lowered by a servo motor 77 for presenting or removing nozzles 57 from the pick up head 37. Detectors 78 are provided for each of the nozzle holders 75 so as to determine when a nozzle is held thereby or removed therefrom. The nozzle holder 75 may include any suitable type of gripping and release device so that when the pick up head 37 is lowered into position on the holders 75, a pick up nozzle 57 may be with withdrawn from or inserted into the pick up head 37 in any suitable manner.

In addition to exchanging nozzles at the nozzle exchanging station 74, when a new nozzle is inserted onto the pick up head 35 the sensor 64 is also utilized to determine that the appropriate nozzle has been exchanged. This nozzle exchanging and recognition procedure is shown in the block diagram of FIG. 6 and will now be described by reference to that Figure.

When the program starts it moves to the step S-1 so as to energize the X—X and Y—Y axis servo motors 42 and 49, respectively so as to bring the pick up head 37 into registry with the nozzle replacing section 74 and specifically initially to a empty nozzle holder 75, assuming that a nozzle is already in place and then to the appropriate nozzle holder 75 that is to contain the nozzle 57 which is to be employed for picking up that particular component 58 which will be picked up. The head 37 is then lowered by actuating the Z—Z axis servo motor of either the entire head assembly 37 (motor 53) and/or the Z—Z axis servo motor of the specific pick up head 56 (59) although this latter motor should be energized initially to completely lower the head 56. The servo motor 77 is then operated so as to raise the nozzle holder 75 so as to either insert or remove the respective nozzle at the step S-2.

Figure 6:
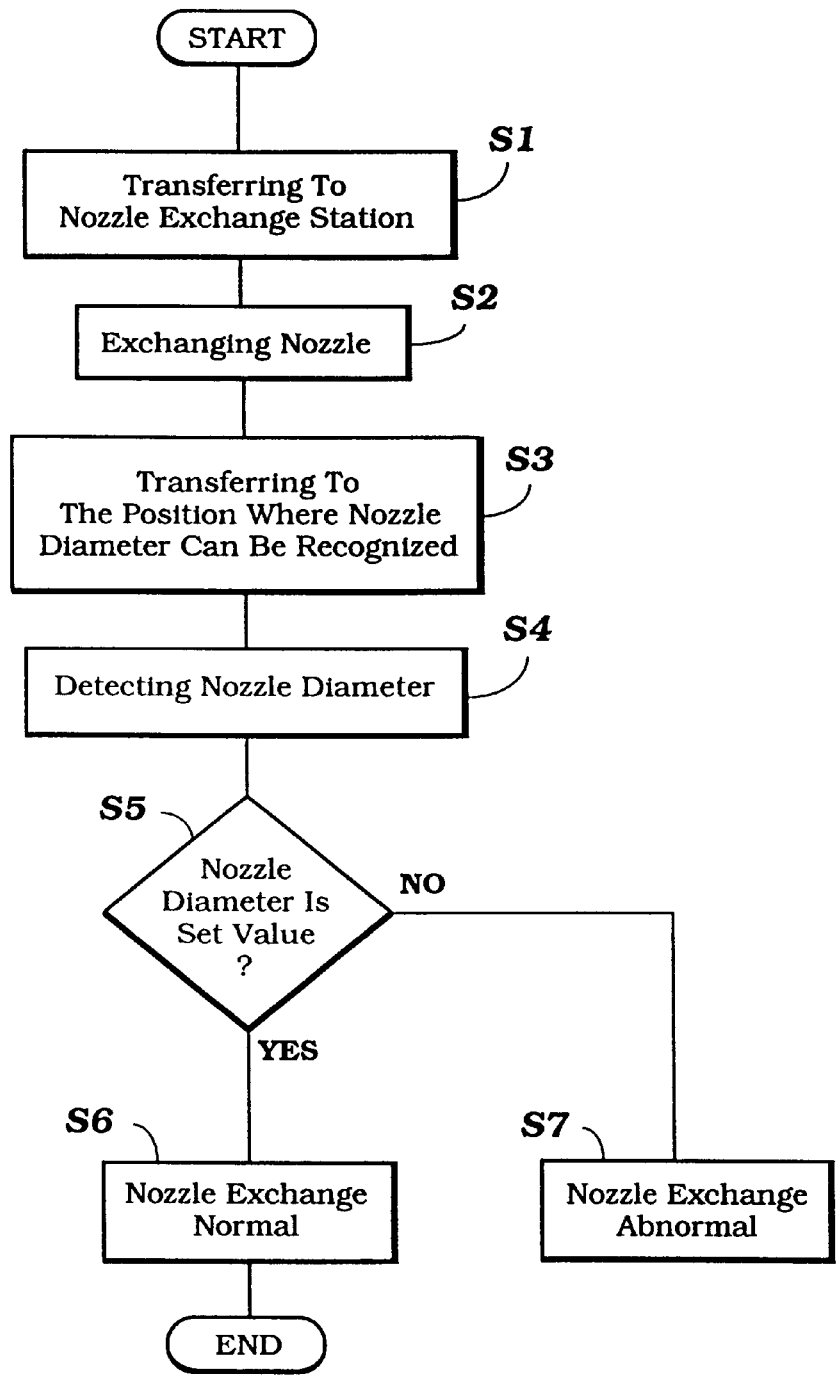
FIG. 6 is block diagram showing the methodology to determine if the correct pick up nozzle is installed.

After the nozzle has been inserted, the Z axis servo motor 59 is energized so as to elevate the pick up nozzle 57 to a position as shown in FIG. 7 and 8 wherein the pick up nozzle 57 will be positioned in registry with the detector 64, this step being indicated in FIG. 6 as the step S-3.

The photo detector 64 is then energized at the step S-4 so as to emit light rays and the CCD will then sense the diameter of the nozzle 57 that is then picked up as the step S-4. The program then moves to the step S-5 so as to compare the dimension measured with the dimension of the pick up nozzle which should have been picked up this information being contained the memory 73 as aforenoted.

If the correct nozzle has been picked up as determined at the step S-5, the program moves to the step S-6 to indicate that the exchange of the nozzle has been done normally and this portion of the program ends. If, however, at the step S-5 it is determined that the appropriate pick up nozzle has not been picked up, the program then moves to the step S-7 so as to indicate the abnormality. This may be done by a warning buzzer warning light or any other suitable mechanism.

Once the appropriate pick up nozzle 57 has been placed in the mounting head assembly 37 and specifically the mounter head 56, the program will start the routine whereby a component of the selected type to match the pick up nozzle is picked up from one of the feeder sections 36 and placed on a printed circuit board 32. This control routine and method of operation of the apparatus will now be described by reference to FIG. 9 for the block diagram and FIGS. 10–14 which illustrate certain portions of the construction and help to demonstrate the method by which the mounting procedure is followed.

Figure 9:
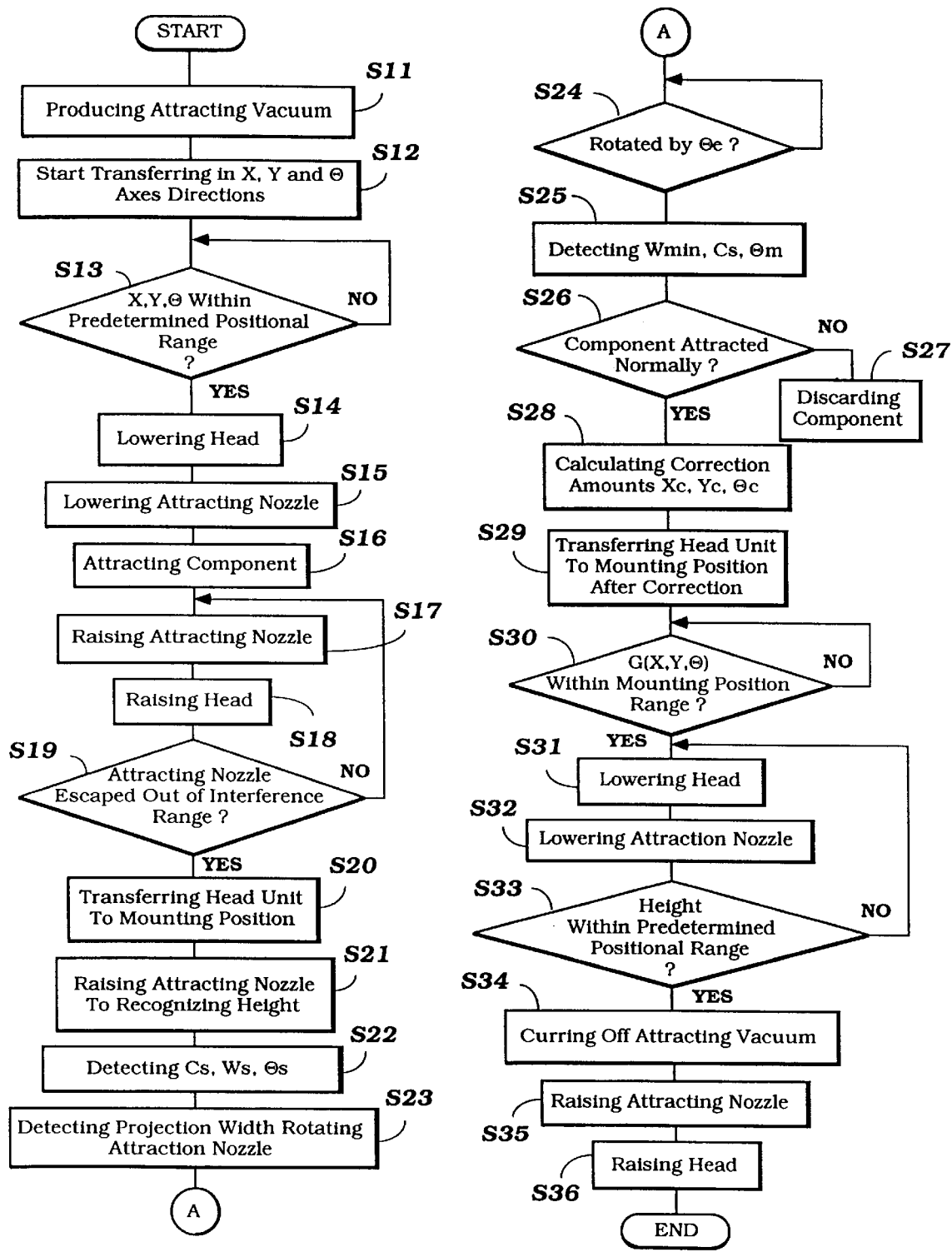
FIG. 9 is block diagram showing the routine of picking up and mounting a component.
Figure 10:
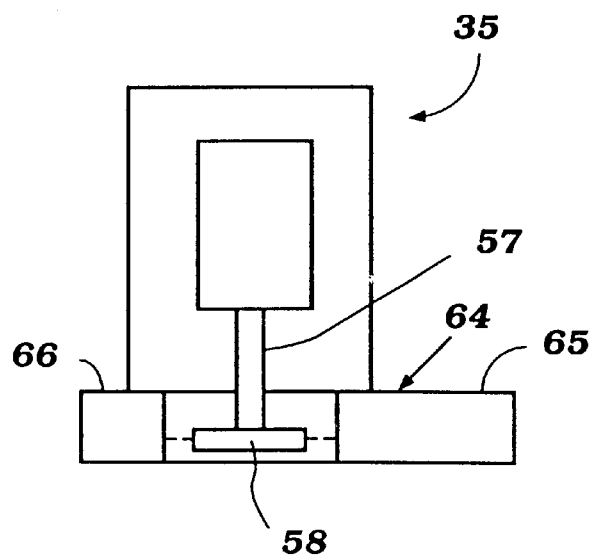
FIG. 10 is a front elevational view, in part similar to FIG. 7 and shows the component being sensed.

Referring first to FIG. 9, when the program of picking up and placing a component 58 starts the program moves to the step S-11 so as to actuate the vacuum source and place the pick up nozzle 57 in a condition so that it can attract and pick up a component 58 from one of the pick up stations 36. It should be noted that in describing this control routine, the order of the steps thus described may be considered to be a preferred form of the invention but certain steps can be performed in a different order and that should be readily apparent to those skilled in the art. For example, the step S-11 of producing the vacuum for pick up could be deferred until after the pick up nozzle 57 is at the station 36 where the component 58 will be picked up.

The program the moves to the step S-12 wherein the main controller 44 and specifically the axis controller 69 causes the X and Y axis motors to operate so as to drive the pick up head assembly 37 to the appropriate station 36. At the step S-13 it is determined if the pick up nozzle 57 is at the correct location for pick up. If it is not, the program repeats until the pick up nozzle 57 is at the appropriate position in the X and Y directions.

When the pick up nozzle 57 is appropriately positioned, the motion of the mounter head 37 stops and the Z axis servo motors 53 and 59 are operated so as to lower the pick up head at the step S-14. The lowering operation continues through the step S-15 until the pick up head is at the correct location so as to pick up the component 58 from the appropriate feed section 36. When this occurs, the program will sense that a component has been picked up at the step S-16. This may be readily determined, for example by a pressure sensor, since the pressure in the vacuum line will decrease (vacuum increases) due to the blocking of the pick up nozzle 57 by the picked up component 58.

The program then moves to the step S-17 so as to raise the pick up nozzle 57 by either operating one or both of the Z axis servo motors 53 and 59. The head is then raised at the step S-18. The program then moves to the step S-19 so as to read the output of the interference position detecting means 68 to determine if the nozzle 57 and component 58 have been moved free of the interference range of the pick up station 36. If they are not, the program repeats back to the step S-17.

When it is determined at the step S-19 that the pick up nozzle 57 and component 58 have cleared the interference area by the output of the interference position detecting means 68, the program moves to the step S-20 to begin movement to the position wherein the component 58 is to be mounted on the printed circuit board 32. During this initial movement both the pick up nozzle will continue to be moved in the Z direction and it will be initially rotated to an angular position $\theta_s$, for a reason that will be described later.

When the nozzle 57 and component 58 and specifically the component 58 have been elevated along the Z axis to the position where the sensing station 64 is located, a sensing operation is initiated which measures the width of the component 58 which is picked up and from this data it is determined whether or not corrections are required to accommodate for a slightly misaligned pick up in the component 58 so as to compensate for this when it is positioned on the printed circuit board 32 and also to determine if the component is correctly picked up. This latter procedure will be described later.

Once the nozzle 57 and specifically the picked up component 58 are positioned in the detecting position of the sensor 64, the detecting and checking procedure begins initially by measuring the projected width $W_s$ of the component on the CCD by determining the area of the CCD 66 that is shaded, the offset of the center of this area from a reference position $W_s$ and the rotated angular position $\theta_s$ of the pick up nozzle which is known from the information derived from the encoder 63 of the R axis servo motor 62. This is all done at the step S-22.

It should be noted that the components 58 will only be roughly positioned in the openings of the feeder tape. The reason for this is it not practical to make the openings the exact size of the components 58 because then they would be difficult to extract from the openings. Also, the feeder sections 36 may not be accurately positioned and the tape may not be accurately fed. Thus, it is necessary to determine both the angular offset about the center of rotation of the pick up nozzle 57 and the offsets in the X and Y axis in order to determine how the component 58 has been picked up so that it can be accurately positioned on the circuit board 32. By determining the offset, it is possible to calculate correction factors $X_c$, $Y_c$ and $\theta_c$ to compensate for this in the mounting position when the feeder nozzle 57 is finally positioned over the circuit board 32 for mounting, as will be described. Basically this operation involves rotating the nozzle 57 and component 58 through an angle, as will be described, and measuring the projected width or length of the component during this rotation as may be seen diagrammatically in FIG. 14. This rotation step is depicted as the step S-23 in FIG. 9.

The program then moves to the step S-24 to determine if the pick up nozzle 57 and component 58 have been rotated through the angle $\theta_e$. If not, the rotation is completed. If, however, the rotation is completed then the program moves to the step S-25 so as to calculate the minimum width ($W_{min}$), offset of the center at which the nozzle has picked up the component ($C_s$), and the angle of rotation ($\theta_{min}$) at which the minimum width condition existed.

The method of measuring the location of pick up of the component 58 will now be described in addition by reference to FIG. 14. As previously noted, the components 58 will be only roughly positioned at the pick up station 36 where the pick up has occurred. Hence, the center of the pick up nozzle O will probably be displaced from the center G of the component 58. The angular position $\theta$ will also vary about the rotational axis R.

In order to insure that the component is in a position other than its minimum width position when initially picked up, once pick up has been accomplished, as has been noted the component is rotated so that it will be rotated clockwise through an angle $\theta_s$ from the initial angular position as determined by an arbitrary line M drawn through the center of the nozzle O which constitutes the ($\theta$=0) position.

Hence, this initial rotation through the angle $\theta_s$ will position the component 58 in the angle $\theta_s$ so that when the light is emitted from the light source 65 to the light sensitive pick up 66, an area indicated as $W_s$ which is equal to the width or length of the component 58 in a plane parallel to the R axis of the pick up nozzle 57 will be occluded. When this measurement is taken, the center G of the component K will be displaced at a distance $C_s$ from a line L which forms the perimeter at one side of the measurement apparatus.

As noted, the pick up nozzle 57 is then rotated in a counter clockwise direction at the step S-23 from the previous clockwise rotation through a position where the minimum projected width $W_{min}$ is measured. At this point, it will be possible to determine the location of the center G at the mid point of $W_{min}$ and hence at a distance $C_{min}$ from the line L. The rotation continues until a rotation through the predetermined angle $\theta_e$ has occurred as previously noted as determined at the step S-25. The specific angle $\theta_e$ does not have to be a large angle and 45° is an appropriate angle so as to insure that the $W_{min}$ condition can be met.

Once the angular measurement necessary to determine the minimum width $\theta_{min}$ from the position $\theta_s$ has been determined and the width at the minimum width position $W_{min}$ and the initial width $W_s$ have been measured, it will then be possible to determine the actual position of the pick up nozzle O relative to the center G of the component 58 both in the X and Y planes and also the angular relationship $\theta$ so as to determine the necessary correction factors in order to place the component 58 at the desired location and orientation on the substrate 32 to which it is to be mounted.

Figure 14:
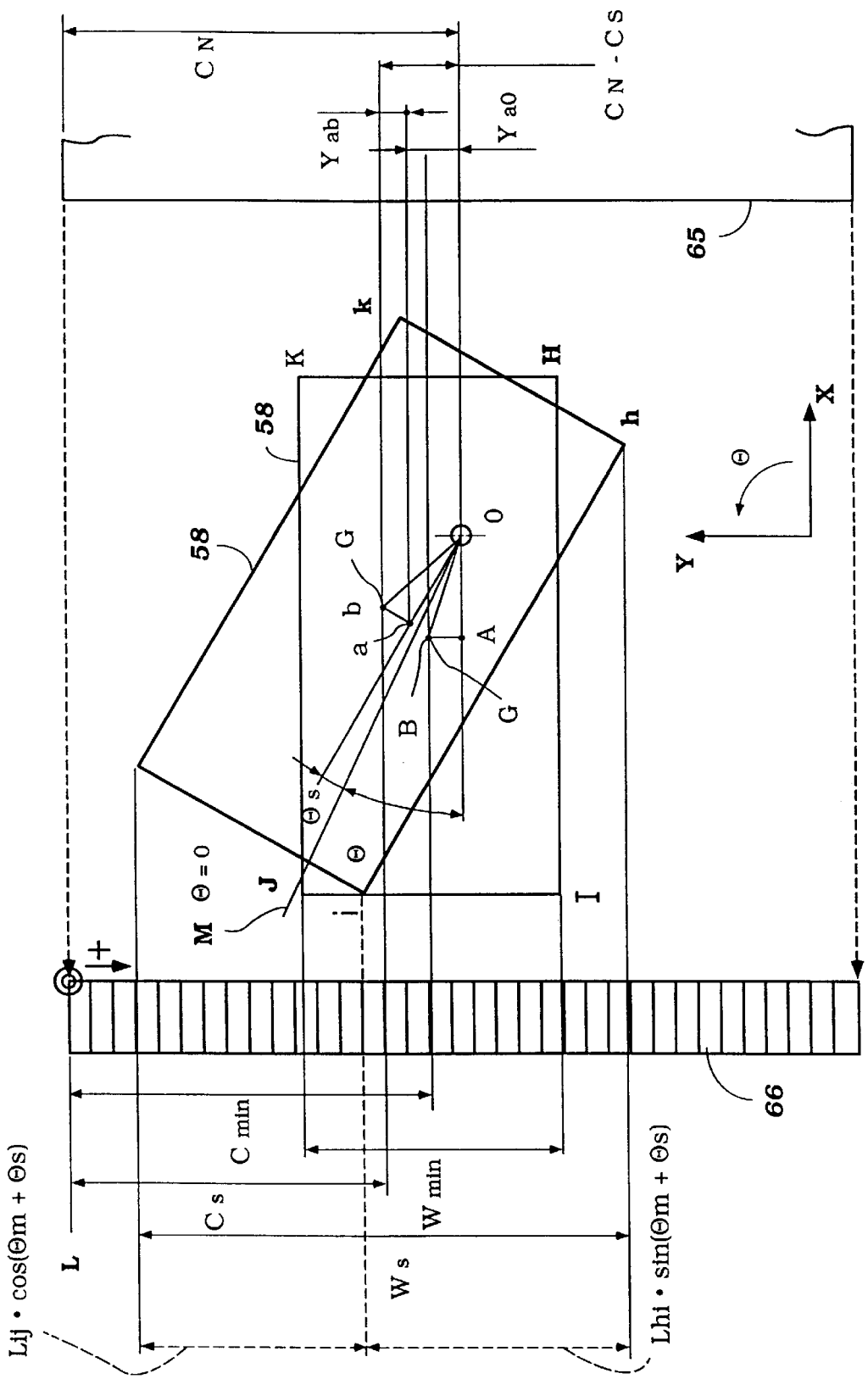
FIG. 14 is a view taken generally in the direction of FIG. 8 and shows how the orientation of the point of picking up of the component and the correct picking up of the component are determined in the optical sensing station.

These calculations may be best understood by reference to FIG. 14 which shows in solid lines the $\theta_s$ position of the component 58 and its minimum width position. In this arrangement, the correction factors $Y_c$ and $\theta_c$ are easily determined in accordance with the following relationships:

$Y_c = C_{min} C_N$ $\theta_c = \theta_{min}$

In these equations, $C_N$ is distance of the center position O of the attracting nozzle 57, as shown in FIG. 14 from the edge of the measurement to the nozzle center which will be constant under all angular rotations of the component 58. Hence, $C_N$ is a known factor and thus $Y_c$ is easily calculated since $C_{min}$ is easily calculated. Hence, the correction amounts $Y_c$ and $\theta_c$ are values that are obtained substantially by actual measurement and no real calculation is required.

The value of $X_c$ however does require calculations using the data $C_s$, $\theta_s$, $C_{min}$ and $\theta_{min}$, obtained by the detected figures. The basis for these calculations are as follows and again reference is made to FIG. 14.

We know that AOB=aOb. Thus, a b=AB=$C_N$−$C_{min}$. Thus the projected length $W_{ab}$ of the side a b on the Y axis (the plane of measurement) can be determined from the following relationship:

$$Y_{ab}=(C_N-C_{min})\cos(\theta_{min}+\theta_s)$$

Similarly the projected length $Y_{ao}$ of the side "a o" on the measurement plane of the Y axis is obtained by the following equation:

$$Y_{ao} = ao\sin(\theta_{min}+\theta_s)$$
$$= (C_N - C_s) - Y_{ab}$$
$$= (C_N - C_s) - (C_N - C_{min})\cos(\theta_{min}+\theta_s)$$

Therefore, the correction amount $X_c$ and the X axis direction can be calculated from the above equation by the following equation:

$$X_c = AO = aO$$
$$= \frac{(C_N - C_s) - (C_N - C_{min})\cos(\theta_{min}+\theta_s)}{\sin(\theta_{min}+\theta_s)}$$

The method of making this calculation is described in more detail on the copending application entitled METHOD FOR MOUNTING COMPONENTS AND AN APPARATUS THEREFOR, filed in my name and the names of Hiroshi Sakurai and Horoyuki Ohta, Ser. No. 08/073,741, filed Jun. 8, 1993 the disclosure of which is incorporated herein by reference.

Figure 11:
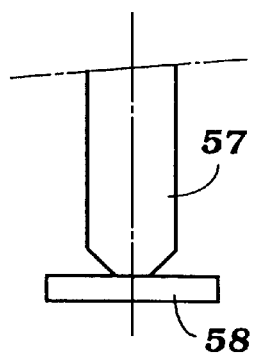
FIGS. 11, 12 and 13 show how a component may be picked up normally in FIG. 11 and two abnormal conditions in FIGS. 12 and 13.
Figure 12:
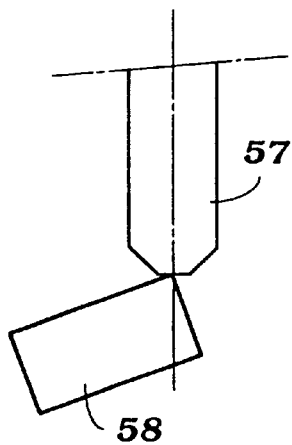
Figure 13:
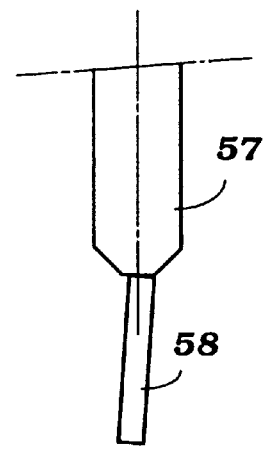

During the process of the making of the calculations aforenoted, which is actually done at the step S-28, the program decides at the step S-26 whether the component has been attracted normally. FIG. 11 shows a normal attraction of the component 58 while FIGS. 12 and 13 show abnormal attractions. As may be seen in FIG. 12, a pick up has occurred close to the edge of the component 58 and as a result, when the nozzle 57 is raised, the component 58 can slip so that its top edge rather than its side edge is exposed. Alternatively and as shown in FIG. 13, the component may actually slip so that a side edge is attracted by the pick up nozzle 57 rather than the top surface thereof.

The measurement previously made of the minimum width thickness of the component 58 $W_{min}$ can be utilized not only to determine the corrective factor but also to determine if the component 58 has been correctly picked up. This determination can be made in accordance with the following equations:

$W_{min} \leq$ (the length of the shorter side of the component 58)

$x$ (1−α), $W_{min} \geq$ (the length of the longer side of the component)

$x$ (1+α), where α is a safety factor.

$\theta_{min} = \theta_s$ $\theta_{min} = \theta_e$

Figure 15:
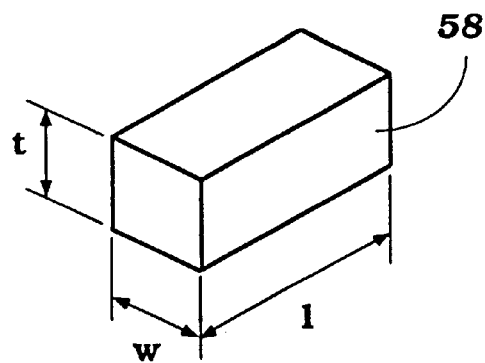
FIG. 15 is a perspective view showing a component of the type which may be picked up.
Figure 16:
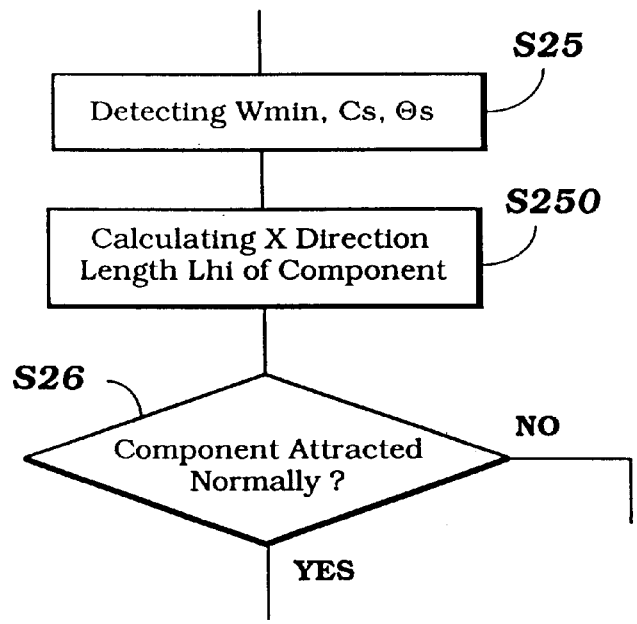
FIG. 16 is a block diagram showing an alternate method for determining if a component has been picked up incorrectly.

The foregoing methodology for determining if the component 58 is correctly picked up is valid only for components where the minimum width of the component being measured is not substantially lesser to the thickness of the component 58. If the component 58 is of a dimension as shown in FIG. 15 where the width is substantially equal to the thickness then it is necessary to make the comparison based upon the relationship of the length of the component $L_{hi}$ as shown in FIG. 15. This necessitates the insertion of a further step after the step S-25 as shown in FIG. 9 this further step being shown in FIG. 16 which is a modification of the program to suit the situation when the width $W_{ij}$ is substantially equal to height T. From the measurement already made it is possible to make a calculation of the X direction length $L_{hi}$ as shown in FIG. 14.

The X direction length $L_{hi}$ of the component 58 is calculated at the step S-250 as follows:

Lhi=$L_{HI}$: X direction length of the component (length of the line segment hi is equal to the length of the line segment HI), and Lij=$L_{ij}$: length of the line segment ij is equal to the length of the line segment IJ, $W_s$ is given by:

$$W_s = L_{hi}\sin(\theta_m+\Theta_s) + L_{ij}\cos(\theta_m+\theta_s)$$

as shown in FIG. 14. Since $L_{ij}=L_{IJ}=W_{min}$ the X direction length of the component $L_{hi}$ is obtained by $$Lhi=\{(W_s - W_{min}\cos(\theta_m+\theta_s)\}/\sin(\theta_m+\theta_s).$$

Since the X direction length $L_{hi}$ of the component obtained above is to be the length of the longer side of the component if the component is attracted normally, in addition to the conditions in the decision at the step S-26, if $L_{hi} \leq$ (longer side length of the component)×(1−β), or $L_{hi} \geq$ (longer side length of the component)×(1+β), where β is a safety factor, the component attraction is decided abnormal.

If at the step S-26 it has been determined that the component is attracted abnormally, the program moves to the step S-27 so as to discard the incorrectly picked up component 58.

If, however, at the completion of the step S-26 it has been determined that the component is attracted normally, then program moves to the step S-28 to make the correction calculations in the manner as aforenoted.

The program then moves to the step S-29 so as to continue moving the head unit 37 to the mounting position now with the correction factors being calculated in. That is, the mounting position is corrected by the $X_c$, $Y_c$ and $\theta_c$ corrections as aforenoted.

At the step S-30 it is determined whether the head assembly 37 is in the mounting position. If it is not, the program repeats until the mounting position is reached.

Once the mounting position is reached, the program moves to the step S-31 so as to lower the whole head assembly 37 by actuating the Z axis servo motor 53 and then to subsequently lower the pick up nozzle 57 and component 58 by actuating their Z axis servo motor 59. This operation is continued at the step S-32 if the height is not determined to be the correct mounting height.

When the correct mounting position is reached as determined at the step 33 then at the step S-34 the attracting vacuum is shut off so as to release the component 58 from the pick up nozzle 57 and deposit it on the circuit board 32. Then at the step S-35, the nozzle Z axis servo motor 59 is actuated to raise it and subsequently at the step S-36, the head Z axis servo motor 53 is operated to raise the mounting head and the program then ends.

Although there is a distinct advantage in both using the detecting head 64 for determining that the correct nozzle 57 has been inserted at the station 74, it is to be understood that a separate optical sensor for this purpose may be provided. Preferably such as separate optical sensor can be mounted in a fixed position immediately adjacent the nozzle insertion station 74.

It should be readily apparent that the described embodiments of the invention are very effective in providing accurate mounting positioning of a component and also insuring against any mistaken positioning or picking up by an incorrect pick up nozzle. Of course, the foregoing description is that of preferred embodiments of the invention and various changes in modifications may be made without departing from the spirit and scope of the invention, as defined by the appended claims.

I claim:

1. A component handling apparatus for accurately positioning components having a mounting surface adapted to be positioned at an accurate location on a substrate surface, said apparatus comprising a feeder station at which components are supplied and a mounting station, fixed spaced from said feeder station, where components are provided, a pick up portion for picking up and positioning a component from said feeder station, a sensing station for recognizing the orientation of said component as picked up by said pick up portion, means for determining from the recognition both the orientation of the component relative to the pick up portion and in addition to the orientation if the component as picked up is held by the pick up portion in such a way that so that it can be positioned properly on the substrate surface, and means for precluding any positioning of the component at said mounting station if the component is not held by the pick up portion in such a way so that its mounting surface is oriented so that it can be positioned properly on the substrate surface and for correcting the position of the component only when held correctly for positioning at said mounting station.

2. A component handling apparatus as set forth in claim 1 wherein the orientation of the component relative to the pick up portion is determined by taking certain measurements of the component and applying those measurements to determine a correction amount when the component is deposited.

3. A component handling apparatus set forth in claim 2 wherein the pick up portion is rotatable about a rotational axis R and moveable along X, Y and Z axes from a pick up station to a deposit station, the sensing station measures the projected length of the component in a plane parallel to the axis of rotation of the pick up portion includes means for measuring the projected length of the component in the plane at two angular rotations and measuring the angular rotation between the two measured positions for determining, the place where the component has been picked up by the pick up portion.

4. A component handling apparatus as set forth in claim 3 wherein the offset of the center of the component from the center of the pick up portion in the X, Y and angular planes are determined.

5. A component handling apparatus as set forth in claim 4 wherein the calculations are made by trigonometric relationships.

6. A component handling apparatus as set forth in claim 5 wherein the component is rotated to a second position wherein the projected length in the plane is at an extreme of the projected length in the plane.

7. A component handling apparatus as set forth in claim 6 wherein the projected length in the second position is the narrowest length.

8. A component handling apparatus as set forth in claim 7 wherein the components are only roughly oriented at the pick up station.

9. A component handling apparatus as set forth in claim 8 wherein the component is rotated to an initial angular position prior to the measurement.

10. A component handling apparatus as set forth in claim 9 wherein the initial rotation is in a direction opposite from the direction of rotation from the first position to the second position.

11. A component handling apparatus as set forth in claim 9 wherein the component is rotated to the initial position prior to the beginning of measurements and when the component is initially picked up.

12. A component handling apparatus set forth in claim 3 wherein the components are only roughly oriented at the pick up station.

13. A component handling apparatus as set forth in claim 12 wherein the component is rotated to an initial angular position prior to the measurement.

14. A component handling apparatus as set forth in claim 13 wherein the initial rotation is in a direction opposite from the direction of rotation from the first position to the second position.

15. A component handling apparatus as set forth in claim 13 wherein the component is rotated to the initial position prior to the beginning of measurements and when the component is initially picked up.

16. A component handling apparatus as set forth in claim 3 wherein the component is rotated to a second position wherein the projected length in the plane is at an extreme of the projected length in the plane.

17. A component handling apparatus set forth in claim 16 wherein the projected length in the second position is the narrowest length.

18. A component handling apparatus as set forth in claim 3 wherein the measuring station comprises a light source and a photo-electric receptor positioned in the plane.

19. A component handling apparatus as set forth in claim 3 wherein the determination whether the component as picked up is held by the pick up portion in such a way that it can be positioned properly is made by comparing the projected length with the known length of the object.

20. A component handling apparatus as set forth in claim 19 wherein the projected length is compared with the known length only if the projected length is substantially different from the thickness of the component.

21. A component handling apparatus as set forth in claim 20 wherein if the projected length is substantially equal to the thickness of the component then the other dimension of the component is calculated from the measurements and compared with the corresponding dimension of the other component to determine if the component is correctly as picked up.

22. A component handling apparatus as set forth in claim 1, wherein the sensing station is operative for sensing only a portion of the pick up portion and a component carried by the pick up portion.

23. A component handling apparatus as set forth in claim 22, wherein the sensing station senses the projected length of the sensed portion of the component in a plane.

24. A component handling apparatus as set forth in claim 23, wherein the determination, if the component is picked up in an orientation so that it can be properly deposited, is made by comparing the extreme measured projected dimension with a first known dimension of the component and if the extreme projected dimension is approximately equal to or less than the first known dimension, it is determined that the component is picked up in an orientation so that it can be properly deposited.

25. A component handling apparatus as set forth in claim 24, wherein the extreme projected dimension is compared with another larger known dimension of the component and if the comparison indicates that the extreme projected dimension is greater than or equal to the known larger dimension, it is assumed that the component is picked up in an orientation so that it can be properly deposited.

26. A component handling apparatus as set forth in claim 25, wherein the component is rotated in the sensing station between first and second positions through a predetermined angle.

27. A component handling apparatus as set forth in claim 26, wherein if the projected dimension is at its extreme in either one of the two rotated positions, it is determined that the component is not picked up in an orientation so that it can be properly deposited.

28. A component handling apparatus for positioning components, said apparatus comprising a feeder station at which components are supplied and a mounting station, fixed spaced from said feeder station, wherein components are provided, a pick up portion adapted to pick up a component, a sensing portion, means for moving said pick up portion and a picked up component into said sensing portion, means in said sensing portion for determining the length of said component as picked up in one coordinate of a three dimensional coordinate system by rotating the pick up portion and component about a rotational axis R the sensing portion measuring the projected length of the component in a plane parallel to the axis of rotation of the pick up portion at two angular positions the second of which is the position where the projected length is at its narrowest and measures the angular rotation between the two measured positions for determining the component, comparing the thus measured length to a selected one of the dimensions of the object and determining that the object has not been correctly picked up if the comparison is not approximately equal and disabling any positioning of the component at said mounting station if it is not correctly picked up.

29. An apparatus as set forth in claim 28 wherein the component is rotated to a second position wherein the projected length in the plane is at an extreme of the projected length in the plane.

30. An apparatus as set forth in claim 29 wherein the projected length in the second position is the narrowest length.

31. An apparatus as set forth in claim 30 wherein the component is rotated to an initial angular position prior to the measurement.

32. An apparatus as set forth in claim 31 wherein the initial rotation is in a direction opposite from the direction of rotation from the first position to the second position.

33. An apparatus as set forth in claim 32 wherein the calculations are made by trigonometric relationships.

34. An apparatus as set forth in claim 33 wherein the projected length is compared with the known length only if the projected length is substantially different from the thickness of the component.

35. An apparatus as set forth in claim 34 wherein if the projected length is substantially equal to the thickness of the component then the other dimension of the component is calculated from the measurements and compared with the known other dimension of the other component to determine if the component is oriented correctly as picked up.

36. A component handling apparatus as set forth in claim 28, wherein the sensing station is operative for sensing only a portion of the pick up portion and a component carried by the pick up portion.

37. A component handling apparatus as set forth in claim 36, wherein the sensing station senses the projected length of the sensed portion of the component in a plane.

38. A component handling apparatus as set forth in claim 37, wherein the determination, if the component is picked up in an orientation so that it can be properly deposited, is made by comparing the extreme measured projected dimension with a first known dimension of the component and if the extreme projected dimension is approximately equal to or less than the first known dimension, it is determined that the component is picked up in an orientation so that it can be properly deposited.

39. A component handling method for accurately positioning components having a mounting surface adapted to be positioned at an accurate location on a substrate surface in an apparatus having a feeder station at which components are supplied and a mounting station, fixed spaced from said feeder station, wherein components are provided and using a pick up portion for picking up and positioning the component comprising the steps of picking up a component with the pick up portion at the feeder station, recognizing the orientation of the component as picked up by the pick up portion, determining from the recognition both the orientation of the component relative to the pick up portion and if the component as picked up is held so that its mounting surface is oriented so that it can be positioned properly on the substrate surface, precluding any positioning of the component at the mounting station if it is not held properly, and positioning the component at the mounting station if it is held properly.

40. A component handling method as set forth in claim 39 wherein the orientation of the component relative to the pick up portion is determined by taking certain measurements of the component and applying those measurements to determine a correction amount when the component is deposited.

41. A component handling method set forth in claim 40 wherein the pick up portion is rotatable about a rotational axis R and moveable along X, Y and Z axes from a pick up station to a deposit station, the measurement measures the projected length of the component in a plane parallel to the axis of rotation of the pick up portion at two angular rotations and measuring the angular rotation between the two measured positions for determining the place where the component has been picked up by the pick up portion.

42. A component handling method as set forth in claim 41 wherein the component is rotated to a second position wherein the projected length in the plane is at an extreme of the projected length in the plane.

43. A component handling method set forth in claim 42 wherein the projected length in the second position is the narrowest length.

44. A component handling method as set forth in claim 41 wherein the components are only roughly oriented at the pick up station.

45. A component handling method as set forth in claim 44 wherein the component is rotated to an initial angular position prior to the measurement.

46. A component handling method as set forth in claim 45 wherein the initial rotation is in a direction opposite from the direction of rotation from the first position to the second position.

47. A component handling method as set forth in claim 45 wherein the component is rotated to the initial position prior to the beginning of measurements and when the component is initially picked up.

48. A component handling method as set forth in claim 39 wherein the offset of the center of the component from the center of the pick up portion in the X and Y planes and angular portions about the R axis are determined.

49. A component handling method as set forth in claim 48 wherein the calculations are made by trigonometric relationships.

50. A component handling method as set forth in claim 49 wherein the component is rotated to a second position wherein the projected length in the plane is at an extreme of the projected length in the plane.

51. A component handling method as set forth in claim 50 wherein the projected length in the second position is the narrowest length.

52. A component handling method as set forth in claim 51 wherein the components are only roughly oriented at the pick up station.

53. A component handling method as set forth in claim 52 wherein the component is rotated to an initial angular position prior to the measurement.

54. A component handling method as set forth in claim 53 wherein the initial rotation is in a direction opposite from the direction of rotation from the first position to the second position.

55. A component handling method as set forth in claim 53 wherein the component is rotated to the initial position prior to the beginning of measurements and when the component is initially picked up.

56. A component handling method as set forth in claim 41 wherein the measurements are made by an optical sensor comprising a light source and a photo-electric receptor positioned in the plane.

57. A component handling method as set forth in claim 41 further including detecting if a component picked up by the pick up portion is correctly picked up by rotating the article in the sensing station.

58. A component handling method as set forth in claim 57 wherein the projected length is compared with the known length only if the projected length is substantially different from the thickness of the component.

59. A component handling method as set forth in claim 58 wherein if the projected length is substantially equal to the thickness of the component then the other dimension of the component is calculated from the measurements and compared with the corresponding dimension of the component to determine if the component is correctly picked up.

60. A component handling method as set forth in claim 40, wherein the sensing station is operative for sensing only a portion of the pick up portion and a component carried by the pick up portion.

61. A component handling method as set forth in claim 60, wherein the determination, if the component is picked up in an orientation so that it can be properly deposited, is made by comparing the extreme measured projected dimension with a first known dimension of the component and if the extreme projected dimension is approximately equal to or less than the first known dimension, it is determined that the component is picked up in an orientation so that it can be properly deposited.

62. A component handling method as set forth in claim 61, wherein the extreme projected dimension is compared with another larger known dimension of the component and if the comparison indicates that the extreme projected dimension is greater than or equal to the known larger dimension, it is assumed that the component is picked up in an orientation so that it can be properly deposited.

63. A component handling method as set forth in claim 62, wherein the component is rotated in the sensing station between first and second positions through a predetermined angle.

64. A component handling method as set forth in claim 63, wherein if the projected dimension is at its extreme in either one of the two rotated positions, it is determined that the component is not picked up in an orientation so that it can be properly deposited.

65. A component handling method for positioning components with an apparatus comprising a feeder station at which components are supplied and a mounting station fixed spaced from said feeder station, wherein components are provided, a pick up portion adapted to pick up a component from said feeder station a sensing portion, means for moving said pick up portion and a picked up component from said feeder station into said sensing portion, said method comprising the steps of determining the length of the component as picked up in one coordinate of a three dimensional coordinate system, comparing the thus measured length to a selected one of the dimensions of the object, determining that the object has not been correctly picked up if the comparison is not approximately equal precluding any positioning of the component at said mounting station if it has not been picked up properly, and positioning the component at said mounting station if it has been picked up properly.

66. An component handling method as set forth in claim 65 wherein the pick up portion is rotated about a rotational axis R the projected length of the component in a plane parallel to the axis of rotation of the pick up portion at two angular positions is measured as is the angular rotation between the two measured positions for determining the length of the component.

67. A method as set forth in claim 66 wherein the component is rotated to a second position wherein the projected length in the plane is at an extreme of the projected length in the plane.

68. A method as set forth in claim 67 wherein the projected length in the second position is the narrowest length.

69. A method as set forth in claim 68 wherein the component is rotated to an initial angular position prior to the measurement.

70. A method as set forth in claim 69 wherein the initial rotation is in a direction opposite from the direction of rotation from the first position to the second position.

71. A method as set forth in claim 70 wherein the calculations are made by trigonometric relationships.

72. A component handling method as set forth in claim 71 wherein the projected length is compared with the known length only if the projected length is substantially different from the thickness of the component.

73. A component handling method as set forth in claim 72 wherein if the projected length is substantially equal to the thickness of the component then the other dimension of the component is calculated from the measurements and compared with the known other dimension of the component to determine if the component is oriented correctly as picked up.

* * * * *